(12) United States Patent
Auburger et al.

(10) Patent No.: US 7,442,559 B2
(45) Date of Patent: Oct. 28, 2008

(54) METHOD FOR PRODUCING AN OPTICAL OR ELECTRONIC MODULE PROVIDED WITH A PLASTIC PACKAGE

(75) Inventors: Albert Auburger, Regenstauf (DE); Hans Hurt, Regensburg (DE); Stefan Paulus, Zeitlarn (DE); Nikolaus Schunk, Maxhutte-Haidhof (DE); Frank Weberpals, Regensburg (DE); Josef Wittl, Parsberg (DE)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 149 days.

(21) Appl. No.: 11/192,444

(22) Filed: Jul. 27, 2005

(65) Prior Publication Data

US 2006/0024851 A1    Feb. 2, 2006

(30) Foreign Application Priority Data

Jul. 28, 2004    (EP) .................................. 04090301

(51) Int. Cl.
*G01R 31/26* (2006.01)
*H01L 21/66* (2006.01)

(52) U.S. Cl. .............................. 438/15; 438/14; 438/18; 257/E21.522

(58) Field of Classification Search .................... 438/14, 438/15, 18, 112; 257/E31.117, E21.522
See application file for complete search history.

(56) References Cited

U.S. PATENT DOCUMENTS

| | | | | |
|---|---|---|---|---|
| 4,523,973 A | * | 6/1985 | Nelson | 216/84 |
| 5,144,747 A | * | 9/1992 | Eichelberger | 29/834 |
| 5,424,249 A | * | 6/1995 | Ishibashi | 438/51 |
| 6,309,566 B1 | | 10/2001 | Muller et al. | |
| 6,372,693 B1 | | 4/2002 | Baumann et al. | |
| 6,735,023 B2 | | 5/2004 | Schunk | |
| 2001/0010356 A1 | * | 8/2001 | Talbot et al. | 250/307 |
| 2003/0052702 A1 | | 3/2003 | Auburger et al. | |
| 2004/0085609 A1 | * | 5/2004 | Fries | 359/242 |
| 2006/0021438 A1 | * | 2/2006 | Klein et al. | 73/623 |

FOREIGN PATENT DOCUMENTS

DE    198 10 060 A1    11/1998

(Continued)

OTHER PUBLICATIONS http://en.wikipedia.org/wiki/Coordinate_system; Accessed May 9, 2008.*

*Primary Examiner*—Michelle Estrada
*Assistant Examiner*—Jarrett J Stark

(57) ABSTRACT

A method for producing an optical or electronic module provided with a plastic package including: providing at least one optical or electronic component, the component having an operative region, via which it is in operative connection with the surroundings in the finished module, encapsulating the component with at least one polymer compound to form the plastic package, before or after the encapsulation, ascertaining the position of the component by direct measurement of the position of the component, aligning the component with respect to a device for partially removing the polymer compound or alignment of such a device with respect to the component, the alignment taking place with allowance for the ascertained position of the component, and partial removal of the polymer compound from the outside such that the polymer compound between the operative region and the outer side of the plastic package is at least partially removed.

14 Claims, 2 Drawing Sheets

FOREIGN PATENT DOCUMENTS

| | | | |
|---|---|---|---|
| DE | 199 09 242 A1 | 8/2000 |
| DE | 101 17 890 A1 | 10/2002 |
| DE | 101 44 467 A1 | 4/2003 |
| DE | 101 50 986 A1 | 4/2003 |
| DE | 101 51 113 A1 | 6/2003 |
| JP | 2003068939 | 3/2003 |

* cited by examiner

METHOD FOR PRODUCING AN OPTICAL OR ELECTRONIC MODULE PROVIDED WITH A PLASTIC PACKAGE

FIELD OF THE INVENTION

The invention relates to a method for producing an optical or electronic module provided with a plastic package, in which, after the encapsulation of the module components with a polymer compound, a component which was in operative connection with the surroundings is partially exposed again in a subsequent method step.

BACKGROUND OF THE INVENTION

It is known to embed optoelectronic modules with a transparent embedding material. For example, DE 199 09 242 A1 discloses an optoelectronic module in the case of which a leadframe with an optoelectronic transducer is positioned in a module package and embedded with a transparent, moldable polymer material. Light is coupled in or out by means of an optical fiber, which is coupled to a connecting piece of the module package. On the leadframe there is also the driver device or receiving device for the optoelectronic transducer.

However, the use of embedding materials that are transparent for the respective range of wavelengths has disadvantages to the extent that transparent embedding materials generally have a high coefficient of thermal expansion and accordingly, when there-are great temperature fluctuations, stresses which can damage the sensitive bonding wire connections in particular occur in the package.

It is therefore advantageous in principle to use for embedding or press-molding the components of a module non-transparent polymer materials provided with fillers which produce a favorable coefficient of thermal expansion of the polymer material. A disadvantage of the use of such polymers as an embedding material is that an optical path cannot be created within the embedding material.

A further problem in particular with the use of a non-transparent embedding compound is that, after the embedding, the exact position of the individual components can no longer be easily seen. However, it may be desirable, for example, to determine exactly the position of an optoelectronic transducer in the module.

Comparable problems may also arise with respect to purely electronic modules provided with a plastic package whenever there is the requirement to bring a component of the module into operative connection with the surroundings and, for this purpose, to determine its position exactly.

SUMMARY OF THE INVENTION

The present invention is accordingly based on the object of providing a method for producing an optical or electronic module provided with a plastic package which makes it possible in a simple and extremely precise way to bring an embedded component of the module into operative connection with the surroundings.

The solution achieving this as provided by the invention is distinguished by the fact that, before or after the encapsulation of the optical or electronic component, the position of the component is ascertained by direct measurement. The component is then aligned with respect to a device for partially removing the polymer compound or the device is aligned with respect to the component, the alignment taking place with allowance for the directly ascertained position in the component. After the alignment, the polymer compound can be partially removed by the device from outside with high precision and in exactly a region to be exposed, the polymer compound between the operative region of the component and the outer side of the plastic package being at least partially removed. It is therefore envisaged to expose the component in question again after the encapsulation with a polymer material, i.e. to remove the covering polymer material again in order that it can come into operative connection with the surroundings, and previously to determine the exact position of the component by direct measurement.

The solution as provided by the invention does not envisage ascertaining the position of the component to be exposed merely indirectly, for example by prior determination of the relative position between the component and a reference geometry, for example the outer geometry of the plastic package or the outer geometry of a carrier on which the component to be exposed is mounted. Rather, the position of the component to be exposed is ascertained by direct measurement. The direct, exact ascertainment of the position of the component to be exposed allows the module then to be opened exactly at the desired position. Tolerances which occur when loading a carrier with the component and when producing the module and which would affect an indirect positional determination are eliminated in this way. The invention is consequently based on the idea of directly determining the position of the integrated component before opening the embedded module and then using the directly determined position as a reference during the partial opening of the plastic package.

It is pointed out that encapsulation of the module does not necessarily take place with only one polymer compound. It is also possible to use a number of polymer compounds, which possibly have different transparencies. For example, it may be provided that the component to be exposed is initially encapsulated with one transparent polymer compound. This is followed by encapsulation with a non-transparent polymer compound. When the polymer compound is subsequently partially removed, it is then adequate for the non-transparent polymer compound to be removed. Depending on the configuration, it is accordingly adequate for the polymer compound between the operative region of the component and the outer side of the plastic package not to be removed completely but possibly only partially. If only a non-transparent polymer compound is used for the encapsulation, however, the operative region of the component is completely exposed.

An operative region of the optical or electrical component refers to any region that permits an operative connection of the component to the surroundings. For example, it is the photosensitive region of a photodiode, the sensor region of a pressure sensor or a temperature sensor, the light-emitting region of a semiconductor laser or an LED or the area of a lens, a mirror or a prism that is facing the outer side of the module.

A direct measurement of the position of the component means that its position (i.e. its coordinates in a three-dimensional system of coordinates) with respect to an external system of coordinates lying outside the module is directly ascertained by measurement. In this external system of coordinates, the device for partially removing the polymer compound is also aligned and positioned. In the case of an indirect measurement of the position, on the other hand, the tolerance-affected module itself would represent the system of coordinates and reference system for the positional determination of the component.

The device for partially removing the polymer compound is aligned with the component, or vice versa, with allowance for the directly ascertained position of the component in the external system of coordinates. An opening in the module that is created in the partial removal of the polymer compound has a minimal tolerance: the distance (offset) between the axis of the component to be exposed and the axis of the module opening is minimal.

In a preferred configuration of the invention, a direct measurement of the position of the component takes place before encapsulation with the at least one polymer compound. The measurement in this case preferably takes place by means of an image recognition system, for example using a camera system and an assigned computer. The information obtained in this way concerning the position of the component thereby serves as a reference when, after the encapsulation of the component, the latter is partially exposed again. In this configuration, it is preferably provided that the position of the component no longer changes after the position has been ascertained.

In a further preferred configuration, the polymer compound used is transparent and, for the direct measurement of the position of the component after the embedding, its position is likewise ascertained by means of an image recognition system. The use of an image recognition system in this case takes place as described above. It is possible here to use an image recognition system for the direct measurement of the position of the component in question, since the polymer compound is transparent.

In a further preferred configuration, at least one polymer compound is non-transparent and a direct measurement of the position of the component only takes place after the embedding. In this case an ultrasonic measuring device or an x-ray measuring device is preferably used for the direct measurement of the position of the component, by means of which device the position of the component to be exposed is ascertained with respect to a system of coordinates in which the device for partially removing the polymer compound is also aligned.

In a preferred configuration, the optical or electronic component is electrically contacted by electrical connections, in particular by means of bonding wires, before the encapsulation with plastic. In this case, the electrical connections preferably lie in a region of the polymer compound in which partial removal of the polymer compound does not take place. The bonding wires therefore cannot be damaged during the exposure of the component.

The optical or electronic component is preferably arranged on a carrier before the encapsulation. The carrier of the module preferably takes the form of a leadframe, also referred to as a metal carrier or a stamped grid. The leadframe preferably has in this case at least one planar carrier region, also referred to as a "die pad" or "chip island", and also a plurality of contact leads, which are located at the edge region of the leadframe. The optical or electronic component is in this case respectively arranged on a carrier region. Instead of a leadframe, however, it is also possible in principle for any other carriers to be used, for example carriers which comprise a patterned film of plastic or a printed circuit board. It is also possible in principle to dispense with a separate carrier entirely.

The optical component is preferably an optoelectronic transmitting component or an optoelectronic receiving component, in particular a photodiode or an LED or a semiconductor laser. However, the optical component may also be, for example, a lens, an optical filter, a prism, a mirror or the like. If the component is an electronic component, it is preferably a sensor, in particular a pressure sensor or a temperature sensor.

For the partial removal of the polymer compound, a milling device or a laser ablation device is used for example. In this case, the actual construction of the device is immaterial. The device must merely permit a defined partial removal of the polymer material.

The step of encapsulating with polymer compound preferably comprises embedding or press-molding the component with the polymer compound. The embedding or press-molding may in this case take place in a special mold, in particular an injection mold.

The invention is explained in more detail below on the basis of an exemplary embodiment with reference to the figures, in which:

DESCRIPTION OF A PREFERRED EXEMPLARY EMBODIMENT

Figure 1:
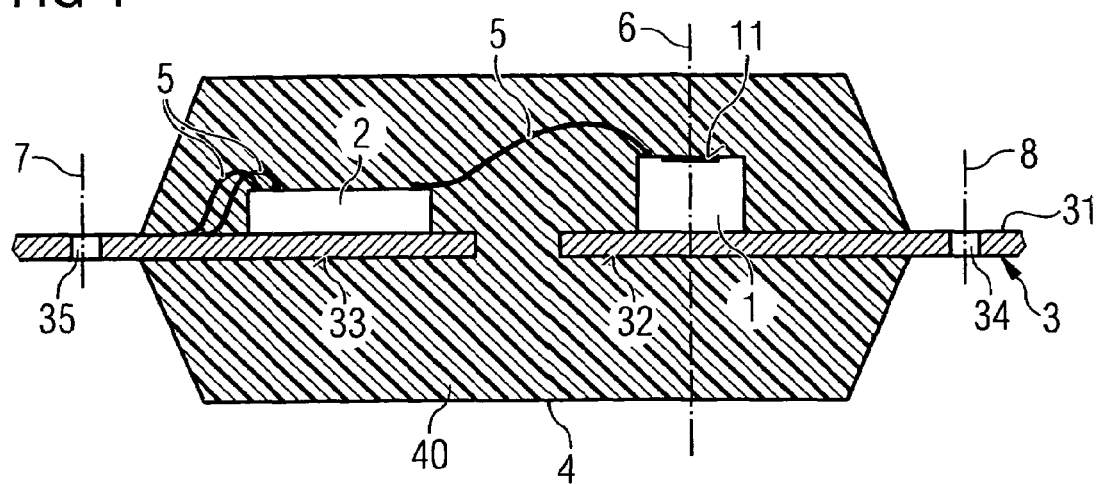
FIG. 1 shows a sectional view of an optical module with an optical component during the production of the module and after embedding of the module with a polymer compound.

FIG. 1 shows an optical module with an optical component 1 and an assigned electronic device 2, which are arranged on a leadframe 3 and embedded with a non-transparent polymer compound 40, which provides a plastic package 4.

The optical component 1 is, for example, a luminescence diode (LED), a semiconductor laser or a photodiode. The electronic device 2 is, for example, a driver or a preamplifier. The optical component 1 preferably takes the form of a prefabricated chip. The electronic device 2 preferably takes the form of an integrated circuit (IC).

The leadframe 3 has two planar carrier areas 32, 33, which are also referred to as "die pads" and on which on the one hand the optical component 1 and on the other hand the electronic device 2 are arranged. Furthermore, the leadframe 3 has at its edge a plurality of contact leads. In this case, the contact leads project from the embedding compound 40. Leadframes 3 of this type are known in the prior art, so are not discussed any further.

Arranged on the two carrier areas 32, 33 are the optical component 1 and the electronic device 2. Electrical contacting of these module components 1, 2 takes place on the one hand by a contact on the underside, which is electrically connected directly to the respective carrier area 32, 33, and on the other hand by means of bonding wires 5.

The optical component 1 has on its upper side an operative area 11. This is, for example, a light-emitting area 11 of an LED chip.

To provide a favorable coefficient of thermal expansion, the polymer compound 40 is provided with a filler and is therefore not transparent for the light emitted or received. The optical path of the optical component 1 is closed.

It is therefore envisaged to produce an opening 9 in the polymer compound 40 in a further method step, so that the operative area 11 of the optical component 1 is exposed and the optical component 1 can enter into operative connection with the surroundings.

In this respect, firstly a method which does not correspond to the method as provided by the invention is described and explained with reference to FIG. 4. In this case, the position of the optical component 1 is determined indirectly in relation to a reference geometry of the module. Such a reference geometry may be provided, for example, by drilled reference holes 34, 35 on the leadframe 3, whereby reference axes 7, 8 are defined. If the relative position of the optical component 1 with respect to these reference axes 7, 8 is known, the position of the optical component 1 can then be inferred indirectly.

Figure 4:
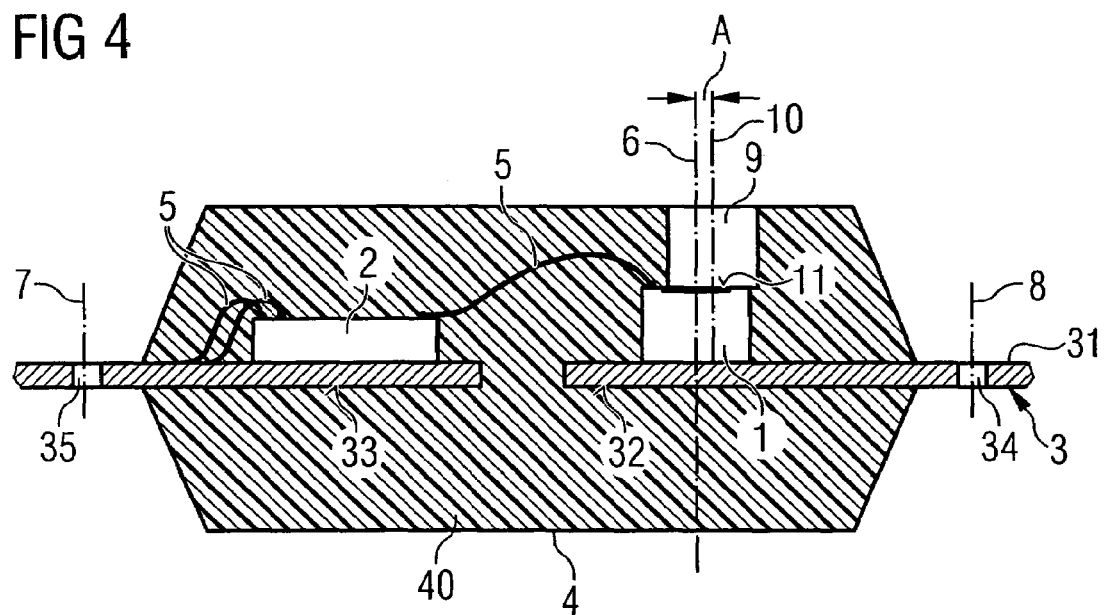
FIG. 4 shows the finished optical module, produced by an alternative method.

FIG. 4 shows the module of FIG. 1 after a clearance 9 has been introduced in the polymer compound 40 by means of such indirect ascertainment of the position of the optical component 1. Such a clearance 9 may be provided, for example, by means of a milling device or by means of a laser ablation device. The disadvantage of this method is, however, that there are considerable cumulative tolerances in the determination of the position of the optical component on the leadframe 3. So it is that tolerances with regard to the position of the optical component 1 on the leadframe 3 and with regard to the arrangement of the drilled reference holes 34, 35 in the leadframe 3 add to one another. If the outer dimension of the plastic package 4 were alternatively to serve as a reference for the determination of the position of the optical component 1, not only the placement tolerance of the optical component 1 on the leadframe 3 but also the tolerance with regard to the outer dimensions of the package 4 would contribute to the cumulative tolerances.

The indirect detection of the position of the component 1 to be exposed therefore necessarily involves a very long series of cumulative tolerances. This may have the effect that a relatively great distance A (offset) exists between the axis 6 of the component 1 to be exposed and the axis 10' of the exposed opening 9 in the plastic package 4. For the sake of better illustration, this is exaggerated somewhat in FIG. 4, which additionally shows the opening 9. The inexact formation of the opening 9 in the plastic package 4 can disadvantageously have the effect, for example, that the optical active area 11 is only partially available for light radiation or for light detection. An inexact alignment of the opening can also lead to problems when coupling further components to the module.

Figure 2:
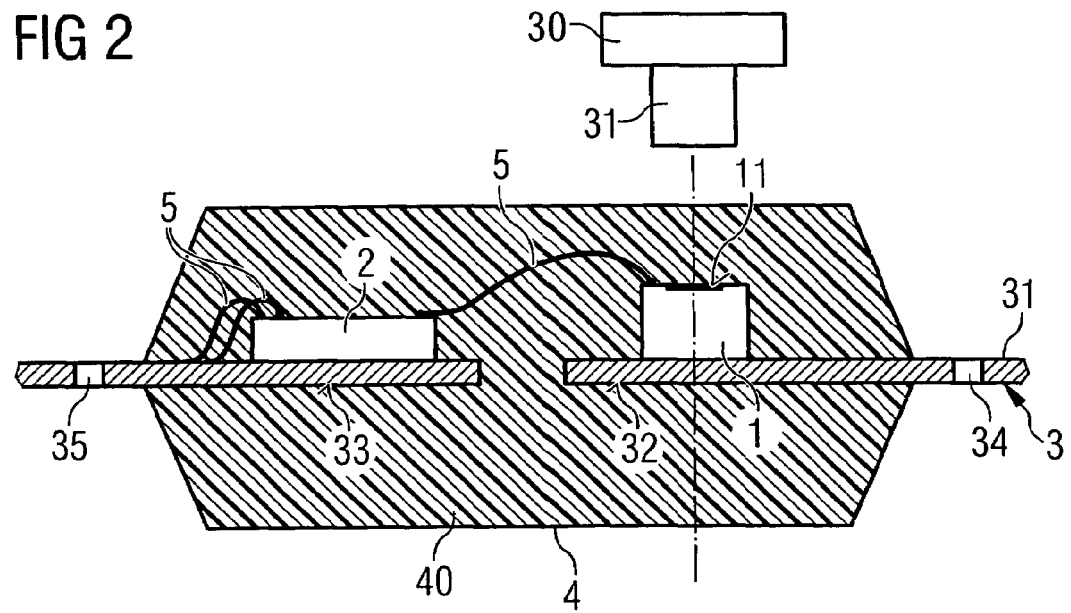
FIG. 2 shows the optical module as shown in FIG. 1, and also means for measuring the position of the optical component and means for partially removing the polymer compound.
Figure 2:
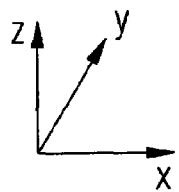
Figure 2:
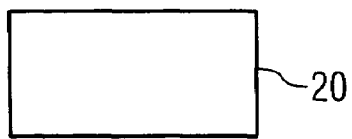

It is therefore envisaged to ascertain the position of the optical component 1 by direct measurement. This is schematically represented in FIG. 2. A schematically represented measuring device 20 ascertains the exact position of the optical component 1 with respect to a system of coordinates. The ascertainment of the position takes place for example by means of an ultrasonic measuring device 20 or an x-ray measuring device 20. In the case of a transparent embedding material or ascertainment of the position of the optical component 1 before the embedding, image recognition or a camera system may also be used for the positional determination. The position determined then serves as a reference for the alignment of the device 34 partially removing the polymer material. In FIG. 2, this device is schematically represented merely by way of example as a milling device 30 with a milling head 31.

The device 30 is then aligned with respect to the optical component 1, or the optical component us aligned with the device 30. This depends on whether the optical component 1 and the module or the device 30 is or are displaceable or more easily displaceable. The alignment takes place with allowance for the directly ascertained position of the optical component 1. The position of the device 30 is in this case fixed by the same system of coordinates in relation to which the position of the optical component 1 was also directly measured.

Figure 3:
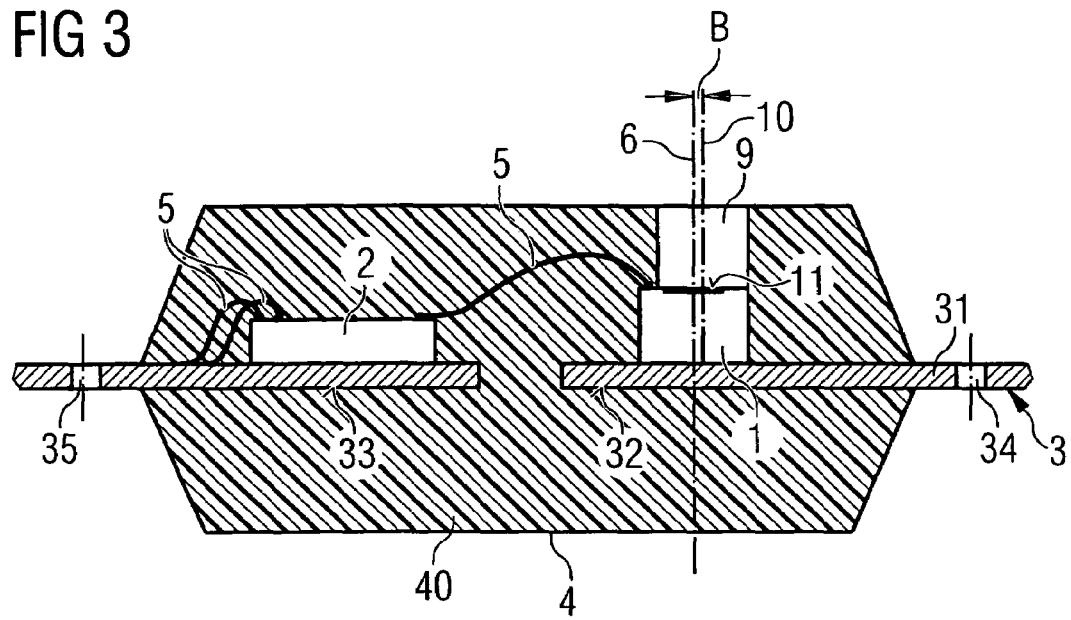
FIG. 3 shows the finished optical module, produced by the method of the present invention.

FIG. 3 shows the module provided in this way with an opening 9. It is evident from this that the offset B between the optical axis 9 of the optical component 1 and the axis of symmetry 10 of the opening 9 is significantly smaller than in the case of the method as shown in FIG. 4.

In the direct measurement, the position of the optical component 1 is determined directly and it is not the case that the position of the optical component is merely inferred indirectly by means of a reference geometry. The package opening 9 can in this way be provided with minimal tolerances.

It is pointed out that the component 1 may also be an electronic component. The component 1 may, for example, be a sensor chip, in particular a pressure sensor or a temperature sensor, as are used in the automobile industry.

Furthermore, it is pointed out that the module may have a number of optical or electronic components of the type described, a direct measurement of the position and exact partial removal of the polymer compound then taking place for each of the components, with an opening being provided in the package in each case.

Finally, it is also pointed out that the production of the optical or electronic module preferably takes place as repeats on a multi-cavity mold, the individual optical or electronic modules being singulated after curing of the polymer material and exposure of the respective components.

We claim:

1. A method for producing an optical or electronic module provided with a plastic package, comprising:
   providing at least one optical or electronic component, the component having an operative region, via which it is in operative connection with the surroundings in the finished module,
   encapsulating the at least one component with at least one polymer compound to form the plastic package,
   after the encapsulation, ascertaining a position of the component by direct measurement of the position of the component in coordinates of a three-dimensional system of coordinates with respect to a system of coordinates external to the module, wherein the direct measurement of the position of the component is ascertained by means of an ultrasonic measuring device,
   aligning the component with respect to a device for partially removing the polymer compound or alignment of such a device with respect to the component, the alignment taking place with allowance for the directly ascertained position of the component, wherein the device for partially removing the polymer compound is aligned with respect to the system of coordinates external to the module,
   partially removing the polymer compound using the device from the outside in such a way that the polymer compound between the operative region of the component and the outer side of the plastic package is at least partially removed.

2. The method according to claim 1, wherein, for the direct measurement of the position of the component, its position is ascertained before the encapsulation with at least one polymer compound by means of an image recognition system and allowance is made for the information obtained in this way concerning the position of the component during the partial removal of the polymer compound.

3. The method according to claim 1, wherein the at least one polymer compound is transparent and, for the direct measurement of the position of the component, its position is ascertained after the encapsulation by means of an image recognition system and allowance is made for the information obtained in this way concerning the position of the component during the partial removal of the polymer compound.

4. The method according to claim 1, wherein the optical or electronic component is electrically contacted by electrical connections before the encapsulation, and the electrical connections lie in a region of the polymer compound in which partial removal of the polymer compound does not take place.

5. The method according to claim 4, wherein the electrical connections are provided at least partially by bonding wires.

6. The method according to claim 1, wherein the optical or electronic component is arranged on a carrier before the encapsulation.

7. The method according to claim 6, wherein the carrier takes the form of a leadframe, having at least one planar carrier region and a plurality of contact leads, the plurality of contact leads being located at an edge region of the leadframe, and wherein the at least one optical or electronic component is arranged on the at least one planar carrier region.

8. The method according to claim 1, wherein the optical component is an optoelectronic transmitting component or an optoelectronic receiving component.

9. The method according to claim 1, wherein the electronic component is a sensor, in particular a pressure sensor or a temperature sensor.

10. The method according to claim 1, wherein a milling device is used for the partial removal of the polymer compound.

11. The method according to claim 1, wherein a laser ablation device is used for the partial removal of the polymer compound.

12. The method according to claim 1, wherein the encapsulating step comprises embedding or press-molding the at least one component with the at least one polymer material.

13. The method according to claim 1, wherein an opening introduced in the plastic package by the device for partially removing the polymer compound has an axis of symmetry which substantially coincides with the axis of the component.

14. A method for producing a module including a component having an operative region that is encapsulated inside a plastic package such that the operative region is at least partially exposed through an opening formed in the plastic package, the component being one of an optical component and an electrical component, the method comprising:

encapsulating the component using at least one polymer such that the polymer forms said plastic package over the component;

ascertaining a position of the component inside the plastic package by direct measurement of the position of the component in coordinates of a three-dimensional system of coordinates relative to a system of coordinates external to the module, wherein the direct measurement of the position of the component is ascertained by means of an ultrasonic measuring device;

aligning the component relative to a polymer removal device in accordance with the directly measured position of the component, wherein the polymer removal device is aligned with respect to the system of coordinates external to the module; and removing a portion of the plastic package using the polymer removal device such that a portion of the polymer located between the operative region of the component and an outer surface of the plastic package is at least partially removed.

* * * * *